United States Patent
Chun et al.

(10) Patent No.: US 9,297,841 B2
(45) Date of Patent: Mar. 29, 2016

(54) METHOD AND APPARATUS FOR MANAGING ELECTRONIC APPLIANCE

(71) Applicant: Samsung Electronics Co., Ltd., Suwon-si (KR)

(72) Inventors: Jake Chun, Seoul (KR); Jeong-il Seo, Seoul (KR); Dong-ik Lee, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 440 days.

(21) Appl. No.: 13/742,594

(22) Filed: Jan. 16, 2013

(65) Prior Publication Data

US 2013/0265061 A1 Oct. 10, 2013

(30) Foreign Application Priority Data

Apr. 10, 2012 (KR) .................. 10-2012-0037552

(51) Int. Cl.
*G01R 31/02* (2006.01)
*G01R 21/00* (2006.01)
*G01D 1/00* (2006.01)
*H04W 4/00* (2009.01)
*G06Q 10/00* (2012.01)
*H04L 12/28* (2006.01)

(52) U.S. Cl.
CPC *G01R 21/00* (2013.01); *G01D 1/00* (2013.01); *G06Q 10/00* (2013.01); *H04L 12/2823* (2013.01); *H04W 4/00* (2013.01); *H04L 2012/285* (2013.01)

(58) Field of Classification Search
CPC ........... G01D 1/00; H04W 4/00; H01L 21/00; H01L 2221/00; H01L 2223/00; H01L 2924/00; G06Q 10/00; G06Q 2220/00

USPC .......................................... 324/537
See application file for complete search history.

(56) References Cited

U.S. PATENT DOCUMENTS

| | | | |
|---|---|---|---|
| 7,634,585 B2 * | 12/2009 | Conley et al. | 710/1 |
| 7,961,544 B2 * | 6/2011 | Ben-Rubi | 365/226 |
| 2007/0240006 A1 * | 10/2007 | Fung | 713/323 |
| 2007/0288774 A1 * | 12/2007 | Tanaka | G06F 1/3209 713/300 |
| 2008/0025235 A1 * | 1/2008 | Mahany et al. | 370/256 |
| 2008/0108295 A1 * | 5/2008 | Fischer | F24F 3/1423 454/239 |

(Continued)

FOREIGN PATENT DOCUMENTS

KR 10-2002-0006815 1/2002
WO 2009/137654 11/2009

OTHER PUBLICATIONS

European Office Action dated May 27, 2015 in European Patent Application No. 13154952.9.

*Primary Examiner* — Huy Q Phan
*Assistant Examiner* — Temilade Rhodes-Vivour
(74) *Attorney, Agent, or Firm* — Staas & Halsey LLP

(57) ABSTRACT

A method and apparatus for managing an electronic appliance, which determines an abnormality of the electronic appliance, such as a malfunction or worn out of the electronic appliance, based on power consumption information measured in the electronic appliance while an operation requested by a user of the electronic appliance is performed by the electronic appliance, and past power consumption information about the same operation performed by the same electronic appliance, and a non-transitory computer-readable recording medium having recorded thereon a program to execute the method.

20 Claims, 7 Drawing Sheets

(56) References Cited

U.S. PATENT DOCUMENTS

| | | | |
|---|---|---|---|
| 2012/0305661 A1* | 12/2012 | Malchiondo | F24F 11/0012 236/44 A |
| 2013/0179973 A1* | 7/2013 | Du | G06F 21/81 726/24 |
| 2013/0204552 A1* | 8/2013 | Lin | G01R 31/2846 702/58 |

* cited by examiner

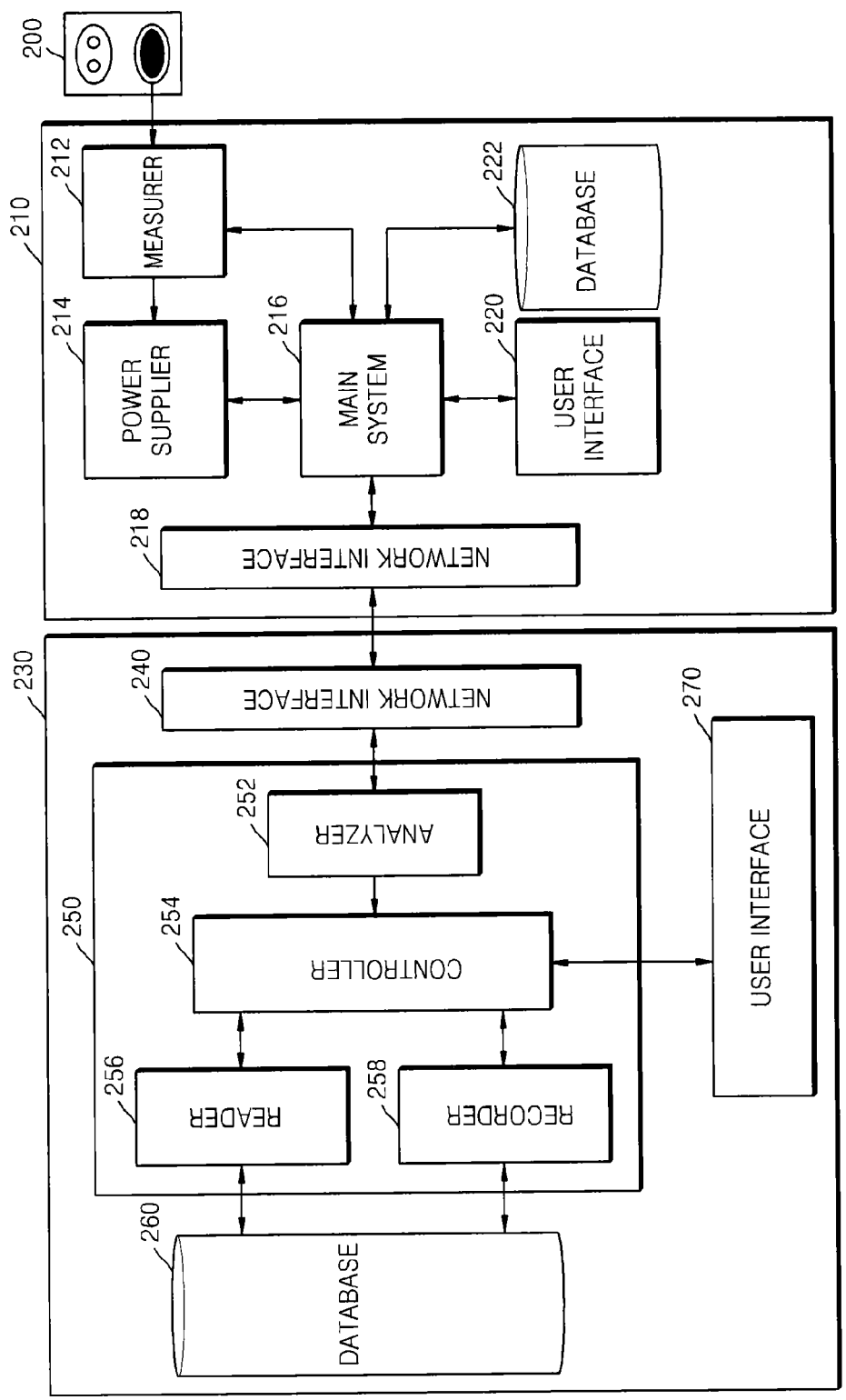

| TYPE OF HOME APPLIANCE | OPERATION | EXTERNAL FACTOR | ACHIEVED TIME | ELECTRIC ENERGY |
|---|---|---|---|---|
| AIR CONDITIONER | DECREASE 3°C | ROOM TEMPERATURE : 24°C | 15 MINUTES | 230W |
| WASHING MACHINE | WOOL WASHING COURSE | AMOUNT OF LAUNDRY: LOW | 53 MINUTES | 120W |
| REFRIGERATOR | DECREASE 1°C | | 9 MINUTES | 80W |
| WASHING MACHINE | SPIN-DRY (8 MINUTES) | | 12 MINUTES | 72W |
| ... | ... | ... | ... | ... |

| DATE | TYPE OF HOME APPLIANCE | OPERATION | EXTERNAL FACTOR | ACHIEVED TIME | ELECTRIC ENERGY |
|---|---|---|---|---|---|
| 201109 | AIR CONDITIONER | DECREASE 3°C | ROOM TEMPERATURE : 24°C | 15 MINUTES | 230W |
| 201109 | WASHING MACHINE | WOOL WASHING COURSE | AMOUNT OF LAUNDRY : LOW | 53 MINUTES | 120W |
| 201109 | REFRIGERATOR | DECREASE 1°C | | 9 MINUTES | 80W |
| 201109 | WASHING MACHINE | SPIN-DRY (8 MINUTES) | | 12 MINUTES | 72W |
| ... | ... | ... | ... | ... | ... |

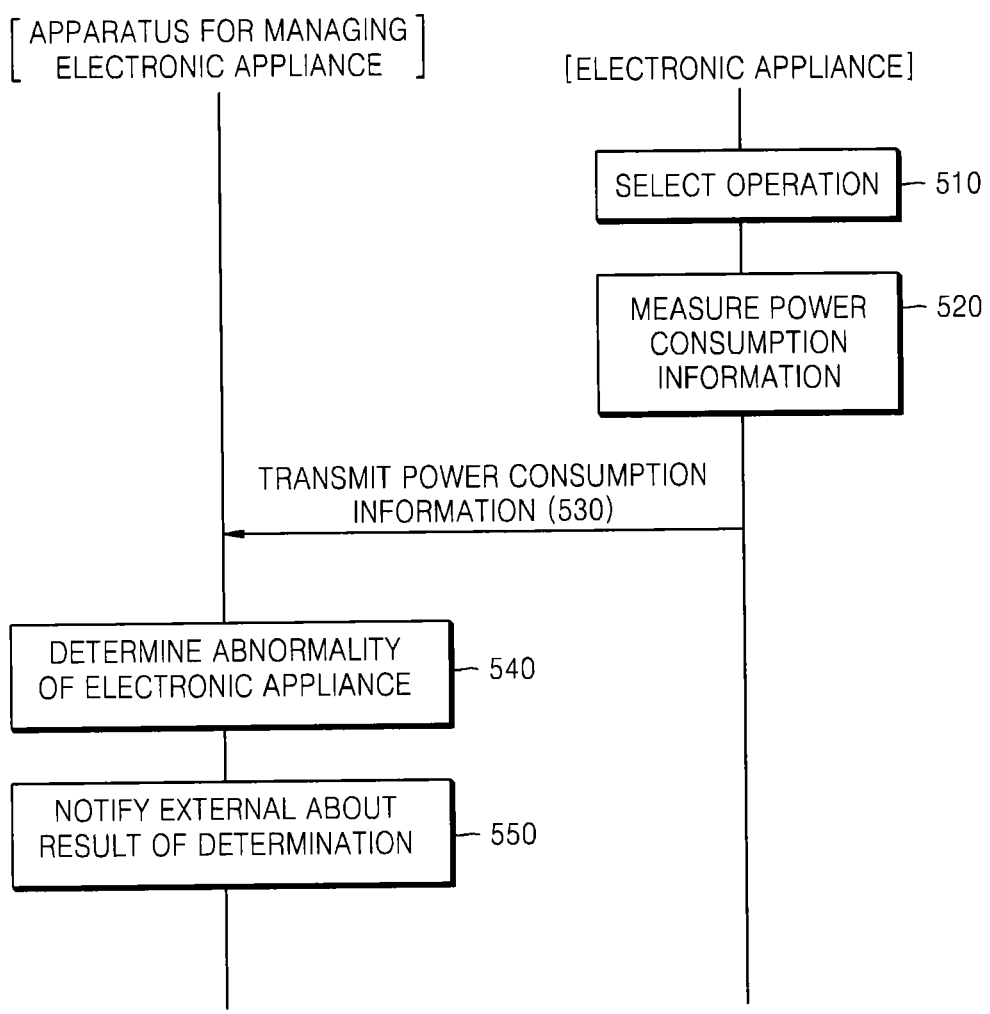

METHOD AND APPARATUS FOR MANAGING ELECTRONIC APPLIANCE

CROSS-REFERENCE TO RELATED APPLICATIONS

This application claims the priority benefit of Korean Patent Application No. 10-2012-0037552, filed on Apr. 10, 2012, in the Korean Intellectual Property Office, the disclosure of which is incorporated herein in its entirety by reference.

BACKGROUND

1. Field

The present disclosure relates to a method and apparatus for managing an electronic appliance, and more particularly, to a method and apparatus for managing an electronic appliance by determining an abnormality of the electronic appliance based on power consumption of the electronic appliance.

2. Description of the Related Art

According to development of networks and communication technologies, electronic appliances may be connected to each other to transmit and receive information. In this regard, technologies in various fields, such as ubiquitous networks, home networks, and smart grids, have been developed. Specifically, an interest in smart grids has increased as reduction of energy and power consumption has come into the spotlight worldwide. Fielding regard to one aspect of smart grids, research into measuring power consumption of an electronic appliance and using the measured power consumption is being conducted.

SUMMARY

The present disclosure provides a method and apparatus for managing an electronic appliance, which determines an abnormality of the electronic appliance based on power consumption information measured in the electronic appliance while an operation requested by a user of the electronic appliance is performed by the electronic appliance, and past power consumption information about the same operation performed by the same electronic appliance, and a non-transitory computer-readable recording medium having recorded there on a program to execute the method.

Additional aspects will be set forth in part in the description which follows and, in part, will be apparent from the description, or may be learned by practice of the presented embodiments.

According to an aspect of the present disclosure, there is provided a method of managing an electronic appliance at home, the method including: receiving first power consumption information measured in the electronic appliance while an operation requested by a user of the electronic appliance is performed by the electronic appliance; updating second power consumption information stored in a database corresponding to the requested operation with the received first power consumption information; determining worn out of the electronic appliance based on the updated second power consumption information and third power consumption information at a predetermined time stored in the database corresponding to the requested operation; and notifying externals about a result of the determining.

According to another aspect of the present disclosure, there is provided a non-transitory computer-readable recording medium having recorded thereon a program to execute the method.

According to another aspect of the present disclosure, there is provided an apparatus to manage an electronic appliance at home, the apparatus including: a network interface to receive first power consumption information measured in the electronic appliance while an operation requested by a user of the electronic appliance is performed by the electronic appliance; a database to store second power consumption information corresponding to the requested operation, and third power consumption information at a predetermined time corresponding to the requested operation; a processor to update the second power consumption information by using the received first power consumption information, and determining worn out of the electronic appliance based on the updated second power consumption information and the third power consumption information; and a user interface to notify externals about a result of the determining.

BRIEF DESCRIPTION OF THE DRAWINGS

The above and other features and advantages of the present disclosure will become more apparent by describing in detail exemplary embodiments thereof with reference to the attached drawings in which:

FIG. 2 is a block diagram of internal structures of an apparatus to manage an electronic appliance, and an electronic appliance, according to an embodiment of the present disclosure;

FIG. 3 is a table for describing information stored in a database of an apparatus to manage an electronic appliance, according to an embodiment of the present disclosure;

FIG. 4 is a table for describing information stored in a database of an apparatus to manage an electronic appliance according to times, according to an embodiment of the present disclosure;

FIG. 5 is a diagram illustrating a relationship between an apparatus to manage an electronic appliance, and an electronic appliance so as to describe a method of managing an electronic appliance, according to an embodiment of the present disclosure;

DETAILED DESCRIPTION

Hereinafter, the present disclosure will be described more fully with reference to the accompanying drawings, in which exemplary embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those of ordinary skill in the art.

Figure 1:
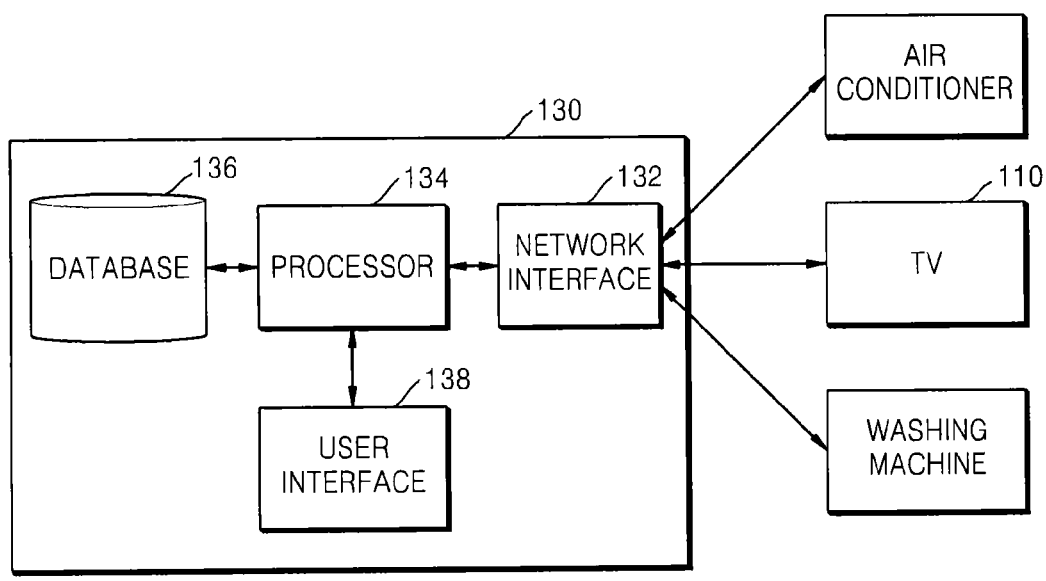
FIG. 1 is a block diagram schematically illustrating a relationship between an apparatus to manage an electronic appliance, and an electronic appliance, according to an embodiment of the present disclosure.

FIG. 1 is a block diagram schematically illustrating a relationship between an apparatus 130 to manage an electronic appliance, and an electronic appliance 110, according to an embodiment of the present disclosure. Referring to FIG. 1, the apparatus 130 according to an embodiment may be connected to the electronic appliance 110 via a network. The apparatus 130 and the electronic appliance 110 may be connected via a wireless communication method, a wired communication method, or a wireless-wired hybrid communication method. The electronic appliance 110 may be a home appliance, and as shown in FIG. 1, may be at least one of a television (TV), an air conditioner, and a washing machine. Referring to FIG. 1, the apparatus 130 according to an embodiment includes a network interface 132, a processor 134, a database 136, and a user interface 138, but it would be apparent to one of ordinary skill in the art that the apparatus 130 of FIG. 1 may include other general-purpose components.

If the electronic appliance 110 is the TV in FIG. 1, the TV may communicate with the apparatus 130, and may receive and transmit information with the apparatus 130. When a user turns on the TV and watches a TV program, the TV uses power supplied to a home via a power plug plugged into a socket at home so as to output a TV program requested by the user on a screen. Power consumption information of the TV used to perform an operation requested by the user may be measured by using a power consumption measuring apparatus (not shown) installed in the TV, and the measured power consumption information may be transmitted to the apparatus 130 via wireless, wired communication, or a wireless-wired hybrid communication method.

As such, the power consumption information measured in the electronic appliance 130 may be received by the apparatus 130 via the network interface 132, and the received power consumption information may be transmitted to the processor 134. The processor 134 may perform an information process for a certain purpose by using information stored in the database 136 and information received from the network interface 132. The user interface 138 operates as an interface between the user and the apparatus 130, and thus may be any one of various input/output devices. For example, the user interface 138 may include an input unit into which a command of the user is input, and an output unit to notify a user about information, wherein the input and output units are combined as a touch screen. The apparatus 130 and the electronic appliance 110 will now be described with reference to FIG. 2 showing internal structures thereof.

FIG. 2 is a block diagram of internal structures of an apparatus 230 to manage an electronic appliance, and an electronic appliance 210, according to an embodiment of the present disclosure. Referring to FIG. 2, the apparatus 230 according to an embodiment includes a network interface 240, a processor 250, a database 260, and a user interface 270, but it would be apparent to one of ordinary skill in the art that the apparatus 230 may include general-purpose components other than components shown in FIG. 2. Also, the electronic appliance 210 according to an embodiment includes a measurer 212, a power supplier 214, a main system 216, a network interface 218, a user interface 220, and a database 222, but it would be apparent to one of ordinary skill in the art that the electronic appliance 210 may include general-purpose components other than components shown in FIG. 2.

As an embodiment of the present disclosure, managing of the electronic appliance 210 by receiving power consumption information transmitted from the electronic appliance 210 will now be described. In this regard, the internal structures of the electronic appliance 210 and apparatus 230 are also described.

The electronic appliance 210 receives power required for an operation of the electronic appliance 210 from a socket 200 provided at home. When an alternating current (AC) power is input to the power supplier 214 by plugging a plug of the electronic appliance 210 into the socket 200, the power supplier 214 converts the AC power to a direct current (DC) power having a suitable size to be used by the electronic appliance 210, and supplies the DC power to an component of the electronic appliance 210, which requires power. Here, the measurer 212 is provided between the socket 200 and the power supplier 214 so as to measure electric energy supplied to the electronic appliance 210. In other words, power consumption of the electronic appliance 210 may be measured by detecting a voltage or current input from the socket 200 to the power supplier 214. The measurer 212 may include a sensor resistor and a differential amplifier, and may measure power consumption in real time.

The main system 216 controls overall functions of the electronic appliance 210, and the main system 216 according to an embodiment may include a controller to control the overall functions of the electronic appliance 210. The main system 216 operates using DC power supplied from the power supplier 214.

The network interface 218 is used for communication between the electronic appliance 210 and an external apparatus. For example, the electronic appliance 210 may transmit power consumption information including power consumption measured by the measurer 212 to the apparatus 230 through the network interface 218 while performing an operation requested by a user.

The user interface 220 obtains an input signal from the user and displays information to the user. For example, the user interface 220 may be an input/output device, such as a display panel, a mouse, a keyboard, a touch screen, a monitor, or a speaker, prepared in the electronic appliance 210.

The database 222 stores data generated during an operation of the electronic appliance 210 or data required for an operation of the electronic appliance 210.

The apparatus 230 may communicate with at least one electronic appliance 210. The apparatus 230 may transmit or receive information to and from the network interface 218 of the electronic appliance 210 by using the network interface 240. For example, when the electronic appliance 210 transmits power consumption information measured by the measurer 212 through the network interface 218 while performing the operation requested by the user, the apparatus 230 receives the transmitted power consumption information through the network interface 240. A method performed by the apparatus to manage the electronic appliance 210 by using the received power consumption information (hereinafter, referred to as first power consumption information) will now be described.

The first power consumption information received by the network interface 240 of the apparatus 230 includes information about a time when the operation requested by the user is performed in the electronic appliance 210 and power consumption by the electronic appliance 210 during the time. Also, the first power consumption information may further include variable information about a variable factor that affects power consumption during the requested operation. The variable information about the variable factor that affects the power consumption may be an external environment or situation that changes power consumption of the electronic appliance 210 even if the same operation is requested to be performed by the same electronic appliance 210. For example, when the electronic appliance 210 is an air conditioner, power consumption may differ when a room temperature is 30° C. and when it is 25° C., when a user operates the air conditioner by setting a desired temperature to 20° C.

Alternatively, when the electronic appliance 210 is a washing machine, power consumption may differ based on the quantity of washing if a user pushes the same wash button to operate the washing machine. Accordingly, the first power consumption information may additionally include information about the external environment or situation of the electronic appliance 210.

The first power consumption information may further include an intrinsic identification sign of the electronic appliance 210 or operation information about an operation of the electronic appliance 210 requested by the user. However, the intrinsic identification sign and the operation information may be transmitted to the network interface 240 of the apparatus 230 from the network interface 218 of the electronic appliance 210 in an individual information form.

The information received by the network interface 240 is transmitted to the processor 250. The processor 250 may include detailed modules, such as an analyzer 252, a controller 254, a reader 256, and a recorder 258.

Regarding information received from the network interface 240, the analyzer 252 divides data included in the information according to characteristics. For example, the analyzer 252 analyzes the first power consumption information to divide the first power consumption information into the time when the operation requested by the user of the electronic appliance 210 is performed, the power consumption by the electronic appliance 210 during the time, and the variable information about the variable factor that affects the power consumption. Also, the intrinsic identification sign of the electronic appliance 210 or the operation information about the operation of the electronic appliance 210 requested by the user may be divided from the first power consumption information if included. If the intrinsic identification sign and the operation information are received by the network interface 240 in an individual information form, the intrinsic identification sign and the operation information may be separated from each other by the analyzer 252.

As the analyzer 252 subdivides and analyzes data included in the received first power consumption information, it is possible to accurately match power consumption information. For example, if the first power consumption information includes the intrinsic identification sign, the operation information, the variable information, the time when the operation requested by the user is performed, and the power consumption during the time, the first power consumption information may be subdivided as much as possible according to data so as to find past power consumption information having the same operation information and the same variable information about the same electronic appliance 210 from the database 260. Accordingly, the times when the same operation is performed by the same electronic appliance under the same conditions and power consumption during those times may be compared by using the first power consumption information and the past power consumption information found in the database 260.

The controller 254 may control the reader 256 to read power consumption information corresponding to the first power consumption information from the database 260 by using the data divided by the analyzer 252, and may control the recorder 258 to update the database 260 by using the first power consumption information.

The reader 256 may read last updated power consumption information (hereinafter, referred to as second power consumption information) corresponding to the first power consumption information from among power consumption information pre-stored in the database 260, according to a control signal input from the controller 254. In order to find the second power consumption information accurately corresponding to the first power consumption information, the reader 256 may read the second power consumption information matching with the first power consumption information regarding all of the intrinsic identification sign, the operation information, and the variable information. For convenience of description, a case of using the second power consumption information matching with the first power consumption information regarding all of the intrinsic identification sign, the operation information, and the variable information will be described. The read second power consumption information is transmitted to the controller 254.

The reader 256 may read power consumption information (hereinafter, referred to third power consumption information) at a predetermined time corresponding to the first power consumption information from among the power consumption information pre-stored in the database 260 from the database 260, according to another control signal input from the controller 254. The predetermined time may be a point of time when power consumption is approximately the same to power consumption initially set by a manufacturer of the electronic appliance or required by the electronic appliance to perform the requested operation. Further, the power consumption initially set by the manufacturer maybe average power consumption of a newly manufactured electronic appliance. Similarly, in order to find the third power consumption information accurately corresponding to the first power consumption information, the third power consumption information matching the first power consumption information regarding all of the intrinsic identification sign, the operation information, and the variable information may be read. For convenience of description, a case of using the third power consumption information matching with the first power consumption information regarding all of the intrinsic identification sign, the operation information, and the variable information will be described. The read third power consumption information is transmitted to the controller 254.

The controller 254 may determine an abnormality of the electronic appliance 210 by using the received first power consumption information, and the second or third power consumption information read from the database 260. Here, the abnormality of the electronic appliance 210 denotes a malfunction or worn out of the electronic appliance 210.

First, the controller 254 compares the first and second power consumption information to determine whether there is a malfunction in the electronic appliance 210. The controller 254 may determine whether there is the malfunction by comparing whether a difference between power consumption included in the first power consumption information and power consumption included in the second power consumption information is higher than a predetermined threshold value constituting a base to determine whether there is a malfunction. Alternatively, the controller 254 may determine whether there is the malfunction by comparing whether a rate of the power consumption included in the first power consumption information and the power consumption included in the second power consumption information is higher than a predetermined threshold value constituting a base to determine whether there is a malfunction. The determining of the malfunction may be performed whenever the network interface 240 receives new first power consumption information from the electronic appliance 210. If it is determined that the electronic appliance 210 is not malfunctioning, the controller 254 updates the second power consumption information by using the first power consumption information so as to maintain recent power consumption information reflecting recent performance of the electronic appliance 210. For example, the second power consumption information may be updated to an average value of the power consumption included in the first power consumption information and the power consumption included in the second power consumption information. Here, the average value may be obtained via any method, such as a harmonic average, an arithmetic average, or a geometric average, based on properties of data included in power consumption information, or via a weighted average.

The recorder 258 may store the updated second power consumption information in the database 260 according to a control signal input from the controller 254. Here, the updated second power consumption information may overwrite the pre-stored second power consumption information, or may be separately stored in the database 260 to preserve all past power consumption information.

The controller 254 may determine the worn out of the electronic appliance 210 by comparing the updated second power consumption information and the third power consumption information. The controller 254 may determine the worn out by comparing whether a difference between power consumption included in the updated second power consumption information and power consumption included in the third power consumption information is higher than a predetermined threshold value constituting a base to determine the worn out. Alternatively, the controller 254 may determine the worn out by comparing whether a rate of the power consumption included in the updated second power consumption information and the power consumption included in the third power consumption information is higher than a predetermined threshold value constituting a base to determine the worn out. The third power consumption information denotes power consumption at the predetermined time stored in the database 260 corresponding to the operation requested by the user. In other words, the third power consumption information denotes power consumption information at the predetermined time matching the first power consumption information in all of the intrinsic identification sign, the operation information, and the variable information. The predetermined time may be input by the user or predetermined in the electronic appliance 210, but may be a point of time when power consumption is approximately the same to power consumption initially set by a manufacturer of the electronic appliance 210 as power consumption or required by the electronic appliance 210 to perform the requested operation. Further, the power consumption initially set by the manufacturer maybe average power consumption of a newly manufactured electronic appliance.

The database 260 stores power consumption information about at least one electronic appliance 210.

The user interface 270 externally notifies the user about the malfunction or worn out of the electronic appliance 210 determined by the processor 250. The user interface 270 may be an input/output apparatus having any shape, such as, a display panel, a mouse, a keyboard, a touch screen, a monitor, or a speaker. For example, when the user interface 270 is a touch screen, the user interface 270 may display the malfunction or worn out of the electronic appliance 210 on a screen.

FIG. 3 is a table 300 for describing information stored in the database 260 of the apparatus 230, according to an embodiment of the present disclosure. Referring to FIG. 3, power consumption information stored in the database 260 includes the intrinsic identification sign of the electronic appliance 210, the operation information about the operation of the electronic appliance 210 requested by the user, the variable information about the variable factor that affects power consumption, the time when the requested operation is performed, and power consumption by the electronic appliance 210 during the time. The power consumption information of FIG. 3 stored in the database 260 is stored corresponding to operations requested by the user of the electronic appliance 210, and the second power consumption information may be stored in the database 260 as such.

FIG. 4 is a table 400 for describing information stored in the database 260 of the apparatus 230 according to times, according to an embodiment of the present disclosure. Referring to FIG. 4, power consumption information stored in the database 260 includes the intrinsic identification sign of the electronic appliance 210, the operation information about the operation of the electronic appliance 210 requested by the user, the variable information about the variable factor that affects power consumption, the time when the requested operation is performed, and power consumption by the electronic appliance 210 during the time. As described above with reference to FIG. 3, the power consumption information is stored in the database 260 not only according to operations requested by the user, but also according to times. In other words, the power consumption information stored in the database 260 of FIG. 4 is stored by classifying power consumption information according to the operations and times, and the third power consumption information may be stored in the database 260 as such. Accordingly, power consumption information at a predetermined time may be easily obtained from the database 260.

FIG. 5 is a diagram illustrating a relationship between an apparatus to manage an electronic appliance, and an electronic appliance so as to describe a method of managing an electronic appliance, according to an embodiment of the present disclosure. Details about the apparatus 230 and the electronic appliance 210 of FIG. 2 are applied to the method of FIG. 5 even if omitted.

In operation 510, an operation of the electronic appliance 210 is selected by the user of the electronic appliance 210. The user may select a desired operation of the electronic appliance 210 by using the user interface 220 of the electronic appliance 210. When the operation is selected, the electronic appliance 210 performs the operation.

In operation 520, the power consumption while the electronic appliance 210 performs the operation is measured by the measurer 212. The measurer 212 may measure the power consumption by detecting the voltage of current of power supplied from the socket 200 to the power supplier 214 of the electronic appliance 210.

In operation 530, the electronic appliance 210 transmits power consumption information including the measured power consumption information to the apparatus 230.

In operation 540, the apparatus 230 determines an abnormality of the electronic appliance 210 by using the received power consumption information from the electronic appliance 210. Here, the abnormality of the electronic appliance 210 denotes a malfunction or worn out of the electronic appliance 210. The apparatus 230 determines the abnormality of the electronic appliance 210 by using information stored in the database 260, as will be described in detail below with reference to FIGS. 6 and 7.

In operation 550, the apparatus 230 notifies externals about the result of determining the abnormality of the electronic appliance 210. The apparatus 230 may display the result on the user interface 270, or transmit the result to the electronic appliance 210 or a portable terminal (not shown) of a user capable of communication.

Figure 6:
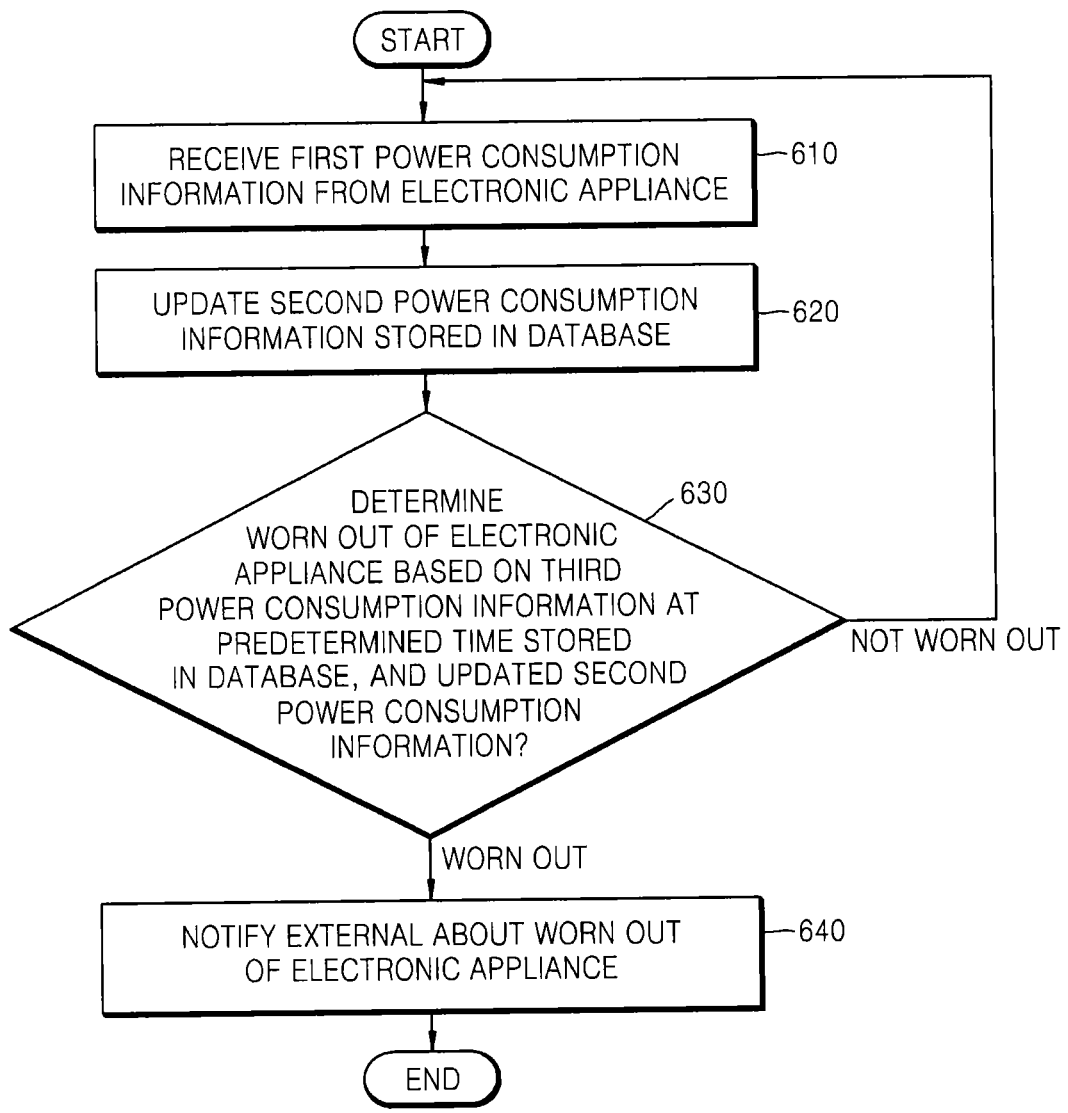
FIG. 6 is a flowchart illustrating a method of managing an electronic appliance, according to an embodiment of the present disclosure.

FIG. 6 is a flowchart illustrating a method of managing an electronic appliance, according to an embodiment of the present disclosure. In detail, FIG. 6 is a flowchart illustrating a method of managing the electronic appliance 210 by determining worn out of the electronic appliance 210 by the apparatus 230.

In operation 610, the apparatus 230 may receive the first power consumption information including the power consumption measured from the electronic appliance 210 through the network interface 240. As well as the measured power consumption, the first power consumption information transmitted from the electronic appliance 210 may further include the intrinsic identification sign of the electronic appliance 210, the operation information about the operation of the electronic appliance 210 requested by the user, the variation information about the variable factor that affects power consumption, and the time when the requested operation is performed.

In operation 620, the apparatus 230 may read the second power consumption information corresponding to the first power consumption information from among power consumption information pre-stored in the database 260, and update the read second power consumption information with the first power consumption information. In order to find the second power consumption information accurately corresponding to the first power consumption information, the second power consumption information matching the first power consumption information in all of the intrinsic identification sign, the operation information, and the variable information may be found, and the read second power consumption information may be updated with the first power consumption information. For convenience of description, the second power consumption information matching the first power consumption information in all of the intrinsic identification sign, the operation information, and the variable information is used. By updating the second power consumption information, recent power consumption information reflecting the recent performance of the electronic appliance 210 may be maintained. The apparatus 230 may calculate the average value of the power consumption included in the first power consumption information and the power consumption included in the second power consumption information, and update the second power consumption information with the calculated average.

In operation 630, the apparatus 230 reads the third power consumption information at a predetermined time corresponding to the first power consumption information from among the power consumption information pre-stored in the database 260, and may determine the worn out of the electronic appliance 210 based on the read third power consumption information and the updated power consumption information. In order to find the third power consumption information accurately corresponding to the first power consumption information, the third power consumption information matching the first power consumption information in all of the intrinsic identification sign, the operation information, and the variable information may be read, and the worn out of the electronic appliance 210 may be determined based on the read third power consumption information and the updated second power consumption information. For convenience of description, the third power consumption information matching the first power consumption information in all of the intrinsic identification sign, the operation information, and the variable information is used. Also, the predetermined time may be input by the user or predetermined in the electronic appliance 210, or may be a point of time when power consumption is approximately the same to power consumption initially set by a manufacturer of the electronic appliance 210 or required by the electronic appliance 210 to perform the requested operation. Further, the power consumption initially set by the manufacturer maybe average power consumption of a newly manufactured electronic appliance.

When the difference between the power consumption included in the updated second power consumption information and the power consumption included in the third power consumption information is higher than the predetermined threshold value, the apparatus 230 may determine that the electronic appliance 210 is worn out. Since the updated second power consumption information includes the recent power consumption reflecting the recent performance of the electronic appliance 210, and the third power consumption information includes the past power consumption when the state of the electronic appliance 210 is normal, the electronic appliance 210 may be determined to be worn out if the difference is large.

When the apparatus 230 determines that the electronic appliance 210 is worn out, operation 640 is performed to notify the user or the electronic appliance 210 about the worn out of the electronic appliance 210. Alternatively, when the apparatus 230 determines that the electronic appliance 210 is not worn out, operation 610 may be performed to receive new first power consumption information from the electronic appliance 210.

Figure 7:
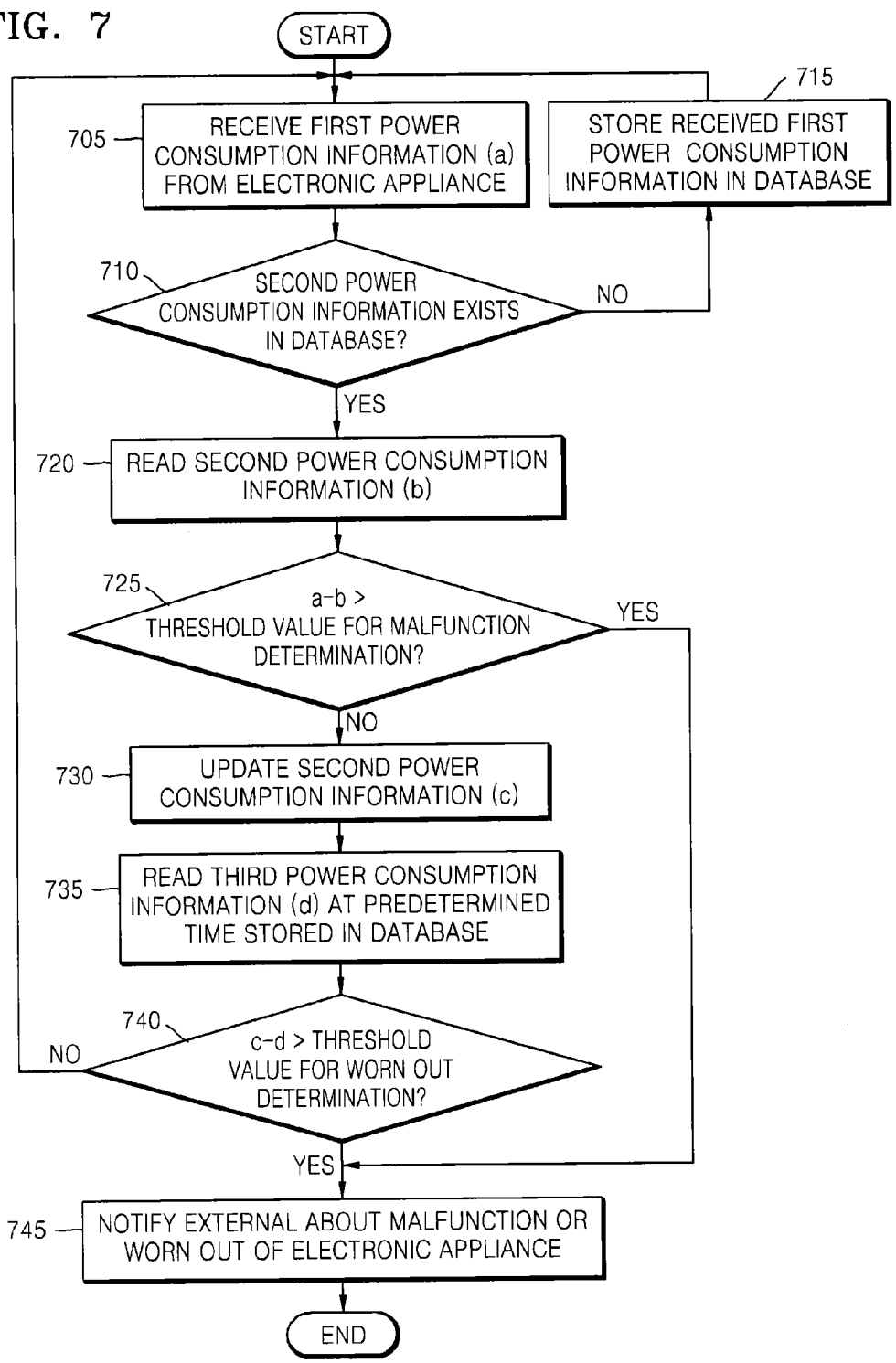
FIG. 7 is a flowchart illustrating a method of managing an electronic appliance, according to another embodiment of the present disclosure.

FIG. 7 is a flowchart illustrating a method of managing an electronic appliance, according to another embodiment of the present disclosure. In detail, FIG. 7 is a flowchart illustrating a method of managing the electronic appliance 210 by determining worn out and a malfunction of the electronic appliance 210 performed by the apparatus 230. Terms used above are also used in descriptions in regard to FIG. 7, and thus definitions thereof will not be repeated herein.

In operation 705, the apparatus 200 receives the first power consumption information including the power consumption measured at the electronic appliance 210, through the network interface 240.

In operation 710, the apparatus 230 determines whether the second power consumption information matching the first power consumption information in all of the intrinsic identification sign, the operation information, and the variable information exists in the database 260. By determining whether the second power consumption information matching the first power consumption information in all of the intrinsic identification sign, the operation information, and the variable information exists from among the power consumption information pre-stored in the database 260, the apparatus 230 may find the second power consumption information accurately corresponding to the first power consumption information.

If the second power consumption information corresponding to the first power consumption information does not exist in the database 260 of the apparatus 230, the received power consumption information is stored in the database 260 in operation 715 since there is no power consumption information to be compared. Next, operation 705 is performed to receive new first power consumption information from the electronic appliance 210.

If the second power consumption information corresponding to the first power consumption information exists in the database 260 of the apparatus 230, the second power consumption information is read from the database 260 in operation 720.

In operation 725, the apparatus 230 determines a malfunction of the electronic appliance 210 based on the read second power consumption information and the received first power consumption information. In other words, the second power consumption information read from the database 260 and the first power consumption information received from the electronic appliance 210 is compared, and the malfunction of the electronic appliance 210 is determined based on the result. For example, a difference between the power consumption included in the first power consumption information received from the electronic appliance 210 and the power consumption included in the second power consumption information read from the database 260 may be determined according to whether the difference is higher than a predetermined threshold value constituting a base to determine a malfunction of an electronic appliance to determine the malfunction. Alternatively, unlike the method of FIG. 7, it may be determined whether a rate of the power consumption included in the first power consumption information received from the electronic appliance 210 and the power consumption included in the second power consumption information read from the database 260 is higher than the predetermined threshold value constituting the base to determine the malfunction of the electronic appliance to determine the malfunction. The malfunction may be determined whenever the network interface 240 receives new first power consumption information from the electronic appliance 210.

When any one of the difference or the rate is higher than the predetermined threshold value, the apparatus 230 determines that the electronic appliance 210 is malfunctioning, and notifies the user of the electronic appliance 210 or the electronic appliance 210 about the malfunction in operation 745.

When any one of the difference or the rate is equal to or lower than the predetermined threshold value, the apparatus 230 determines that the electronic appliance 210 is not malfunctioning, and operation 730 is performed.

In operation 730, the apparatus 230 updates the second power consumption information by using the received first power consumption information so as to store recent power consumption information reflecting recent performance of the electronic appliance 210 in the database 260. For example, the second power consumption information may be updated by using an average value of the power consumption included in the first power consumption information received from the electronic appliance 210 and the power consumption included in the second power consumption information read from the database 260.

In operation 735, when the third power consumption information corresponding to the first power consumption information exists in the database 260 of the apparatus 230, the third power consumption information is read from the database 260. Here, the apparatus 230 may read the third power consumption information at a predetermined time matching the first power consumption information in all of the intrinsic identification sign, the operation information, and the variable information, from among the power consumption information pre-stored in the database 260, from the database 260. Here, the predetermined time may be input by the user or pre-set in the apparatus 230 to read the third power consumption information.

In operation 740, the apparatus 230 may compare the updated second power consumption information and the read third power consumption information to determine worn out of the electronic appliance 210. The controller 254 may determine whether a difference between the power consumption included in the updated second power consumption information and the power consumption included in the third power consumption information read from the database 260 is higher than a predetermined threshold value constituting a base to determine worn out of an electronic appliance to determine the worn out. Alternatively, unlike the method of FIG. 7, the apparatus 230 may determine whether a rate of the power consumption included in the updated second power consumption information and the power consumption included in the third power consumption information is higher than the threshold value constituting the base to determine the worn out of the electronic appliance to determine the worn out.

When any one of the difference and the rate is higher than the predetermined threshold value, the apparatus 230 determines that the electronic appliance 210 is worn out, and notifies the user of the electronic appliance 210 or the electronic appliance 210 about the worn out in operation 745.

When any one of the difference and the rate is equal to or lower than the predetermined threshold value, the apparatus 230 determines that the electronic appliance 210 is not worn out, and operation 705 is performed to receive new first power consumption information.

Figure 8:
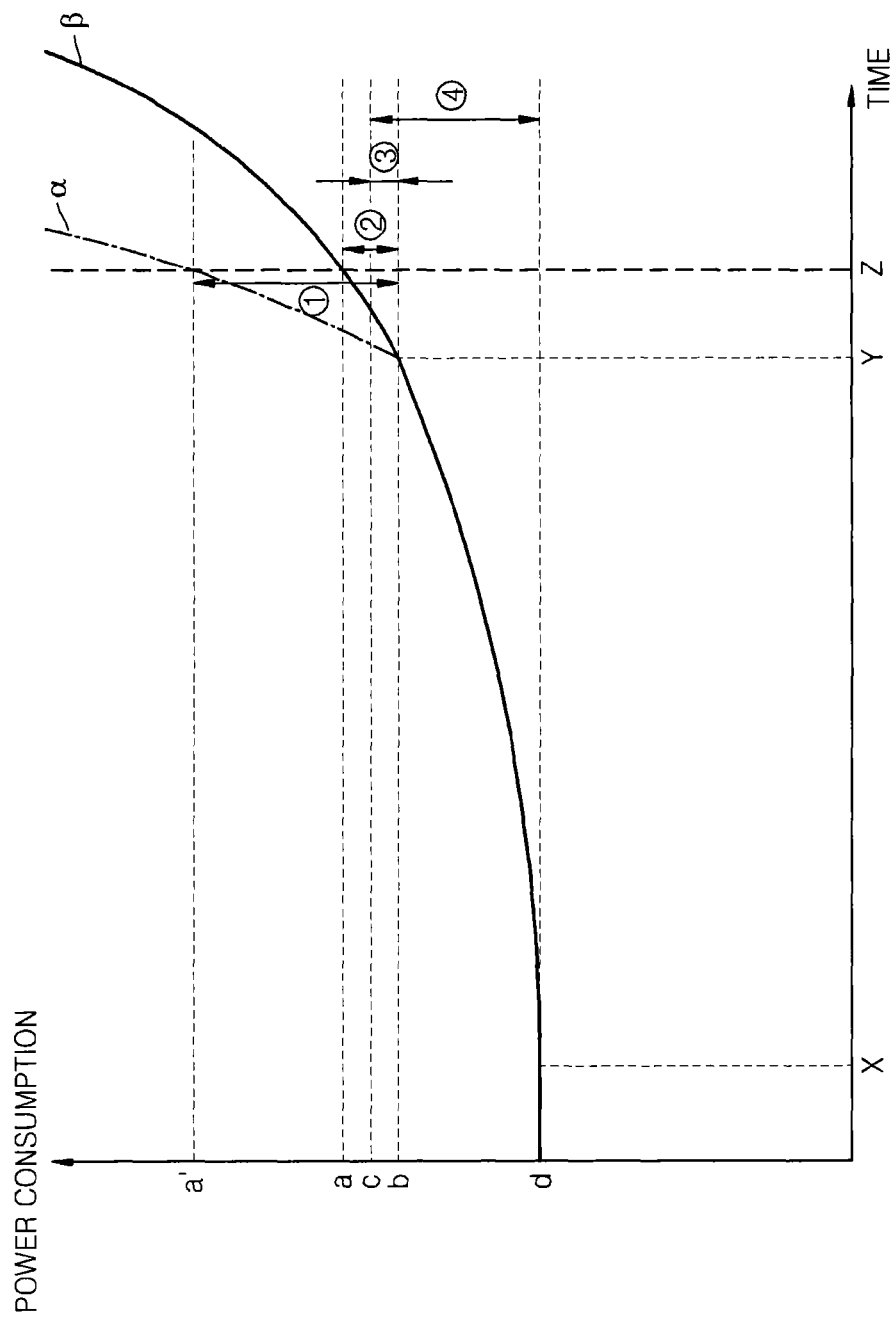
FIG. 8 is a graph for describing cases when an electronic appliance may be determined to be malfunctioning or worn out, according to an embodiment of the present disclosure.

FIG. 8 is a graph for describing cases when the electronic appliance 210 may be determined to be malfunctioning or worn out, according to an embodiment of the present disclosure. Referring to FIG. 8, the graph illustrates a first curve denoted by α and a second curve denoted by β. The first curve α shows the power consumption of an electronic appliance and the second curve β shows the power consumption of another electronic appliance. The first curve α is used to show the malfunction of the electronic appliance and the second curve β is used to describe the worn out of another electronic appliance, as an example. A horizontal axis denotes an elapsed time of using the electronic appliance 210, and a vertical axis denotes power consumption corresponding to a predetermined operation requested by the user. For convenience of description, the first and second curves α and β are respectively shown in an alternate long and short dash line and a solid line, and are identical until a point of time Y. Also, it is assumed that the electronic appliance 210 gradually uses more power consumption while performing the requested operation due to a malfunction or performance deterioration over time.

Referring to the first curve α, first power consumption is a' at a point of time Z and last-updated second power consumption is b at the point of time Y. When the power consumption included in the first power consumption information is a' and the power consumption included in the last-updated second power consumption information is b, which are described above, the difference thereof is ① shown in FIG. 8. When the difference ① is higher than the predetermined threshold value constituting the base to determine the malfunction of the electronic appliance 210, it may be determined that the electronic appliance 210 is malfunctioning.

Referring to the curve β, first power consumption is a at the point of time Z and last-updated second power consumption is b at the point of time Y. When the power consumption included in the first power consumption information is a and the power consumption included in the last-updated second power consumption information is b, the difference therebetween is ②. When the difference ② is higher than the predetermined threshold value constituting the base to determine the malfunction of the electronic appliance 210, it may be determined that the electronic appliance 210 is malfunctioning.

If the predetermined threshold value is lower than the difference ① and higher than the difference ②, the electronic appliance 210 is determined to be malfunctioning if the electronic appliance 210 has the power consumption of the first curve α, but is determined not to be malfunctioning if the electronic appliance 210 has the power consumption of the second curve β. Accordingly, since the power consumption of the second curve β is not malfunctioning, the electronic appliance 210 having the power consumption of the second curve β updates the second power consumption information, wherein updated second power consumption is denoted by c which may be an average value of the first power consumption of the second curve β and the second power consumption of the second curve β in FIG. 8.

According to an embodiment, when it is determined that the electronic appliance 210 is not malfunctioning, a determination of whether the electronic appliance 210 is worn out to determine an abnormality of the electronic appliance 210 is performed. A difference between the updated second power consumption c and last-updated second power consumption b is denoted by ③, but it is difficult to determine the worn out of the electronic appliance 210 by using the difference ③, because the difference ③ is not suitable for a comparative value to determine worn out due to similar point of time when the updated second power consumption c and the last-updated second power consumption b occur. In this case, the worn out of the electronic appliance 210 may be determined by comparing power consumption at a predetermined time pre-set in the apparatus 230 and the latest power consumption. For example, the predetermined time pre-set is a point of time when power consumption approximately the same to power consumption set by a manufacturer of the electronic appliance as power consumption required by the electronic appliance while the requested operation is performed is stored in the database. When the predetermined time is a point of time X, the power consumption included in the third power consumption information described above is d. A difference between the updated second power consumption c and the third power consumption d at the predetermined time is denoted by ④.

If the predetermined threshold value constituting the base to determine the worn out is lower than the difference ④ and higher than the difference ③, the electronic appliance 210 having the power consumption of the second curve β is not malfunctioning but is worn out.

An abnormality of an electronic appliance, such as worn out of the electronic appliance, may be determined by using power consumption information measured in the electronic appliance while an operation requested by a user is performed by the electronic appliance, and using past power consumption information stored in a database with respect to the same electronic appliance and the same operation. Accordingly, a structure of the electronic appliance may be simplified, and thus the electronic appliance may be minimized, since the electronic appliance does not have to include a sensor to detect abnormality, a logic device to determine abnormality, or a resource, such as a memory, for a logic operation.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A method of managing an electronic appliance, the method comprising:
   receiving first power consumption information measured in the electronic appliance while an operation of the electronic appliance is performed by the electronic appliance;
   updating second power consumption information stored in a database corresponding to the operation with the received first power consumption information;
   determining a performance of the electronic appliance by comparing the updated second power consumption information and reference power consumption information, stored in the database, corresponding to the operation.

2. The method of claim 1, wherein the updating comprises updating power consumption included in the second power consumption information with an average value of power consumption included in the first power consumption information and power consumption included in the second power consumption information.

3. The method of claim 1, further comprising:
   providing a notification regarding the determined performance.

4. The method of claim 1, wherein the comparing comprises determining whether any one of a difference and a rate of power consumption included in the updated second power consumption information and power consumption included in the reference power consumption information is higher than a predetermined threshold value constituting a base for determining the performance of the electronic appliance.

5. The method of claim 1, further comprising, before the updating, determining whether there is a malfunction of the electronic appliance based on the received first power consumption information and the second power consumption information, and
   the updating comprises updating the second power consumption information when it is determined that the electronic appliance is not malfunctioning.

6. The method of claim 5, wherein the determining of the malfunction comprises:
   comparing the received first power consumption information and the second power consumption information; and
   determining whether there is the malfunction of the electronic appliance based on a result of the comparing.

7. The method of claim 6, wherein the comparing comprises determining whether any one of a difference and a rate of power consumption included in the received first power consumption information and power consumption included in the second power consumption information is higher than a predetermined threshold value constituting a base for determining whether there is the malfunction of the electronic appliance.

8. The method of claim 5, wherein the determining of the malfunction is performed whenever the first power consumption information is received from the electronic appliance.

9. The method of claim 1, further comprising:
   after receiving the first power consumption information, determining whether the second power consumption information exists in the database; and
   when it is determined that the second power consumption information does not exist, storing the received first power consumption information as the second power consumption information, and
   the updating is performed when it is determined that the second power consumption information exists.

10. The method of claim 1, wherein the first power consumption information comprises a time when the operation is performed, and power consumption during the time.

11. The method of claim 10, wherein the first power consumption information further comprises variable information about variable factors affecting the power consumption during the operation.

12. The method of claim 1, wherein the second power consumption information is the last updated power consumption information in the database according to the operation before a point of time when the first power consumption information is received.

13. The method of claim 1, wherein the predetermined time is a point of time when power consumption is approximately the same to power consumption initially set by a manufacturer of the electronic appliance or required by the electronic appliance to perform the operation.

14. A non-transitory computer-readable recording medium having recorded thereon a program to execute the method of claim 1.

15. An apparatus to manage an electronic appliance, the apparatus comprising:
- a network interface to receive first power consumption information measured in the electronic appliance while an operation of the electronic appliance is performed by the electronic appliance;
- a database to store second power consumption information corresponding to the operation, and reference power consumption information corresponding to the operation;
- a processor to update the second power consumption information by using the received first power consumption information, and to determine a performance of the electronic appliance by comparing the updated second power consumption information and the reference power consumption information.

16. The apparatus of claim 15, wherein the processor comprises:
- a reader to read the second power consumption information and the reference power consumption information from the database;
- a controller to perform the updating of the read second power consumption information, and the determining of the performance of the electronic appliance; and
- a recorder to record the updated second power consumption information in the database.

17. The apparatus of claim 16, further comprising:
- a user interface to provide a notification regarding the determined performance.

18. The apparatus of claim 16, wherein the processor further comprises an analyzer to divide data included in the received first power consumption information according to characteristics.

19. The apparatus of claim 15, wherein the processor comprises:
- a reader to read the second power consumption information and the reference power consumption information from the database;
- a controller to determine whether there is a malfunction of the electronic appliance based on the read second power consumption information and the received first power consumption information, update the read second power consumption information by using the received first power consumption information when it is determined that the electronic appliance is not malfunctioning, and the determining of the performance of the electronic appliance; and
- a recorder to record the updated second power consumption information in the database.

20. The apparatus of claim 19, wherein the controller compares the read second power consumption information and the received first power consumption information, and determines whether there is the malfunction of the electronic appliance based on a result of the comparing.

\* \* \* \* \*